United States Patent

Owens et al.

[15] 3,665,211

[45] May 23, 1972

[54] SURFACE ACOUSTIC WAVE COMPUTER LOGIC ELEMENTS

[72] Inventors: John M. Owens, Newport Beach; Gary F. Sallee, Yorba Linda, both of Calif.

[73] Assignee: North American Rockwell Corporation

[22] Filed: Jan. 11, 1970

[21] Appl. No.: 105,206

[52] U.S. Cl. ................................307/117, 307/149, 330/30, 310/8.1

[51] Int. Cl. ........................................................H01h 35/00

[58] Field of Search .......................310/8.5, 8.1, 8.2; 330/30; 307/116, 117, 118, 149

[56] References Cited

UNITED STATES PATENTS

| | | | |
|---|---|---|---|
| 2,859,346 | 11/1958 | Firestone et al. | 330/30 UX |
| 3,446,975 | 5/1969 | Adler et al. | 330/30 UX |

*Primary Examiner*—Herman J. Hohauser
*Attorney*—L. Lee Humphries, H. Fredrick Hamann and Joseph E. Kieninger

[57] ABSTRACT

A complete set of logic elements utilizing the basic combination of two transducers adapted to convert electrical pulses to surface acoustical waves and a third transducer which converts the surface acoustical waves received from the first two transducers to an electrical pulse is disclosed. Surface acoustical waves are utilized to provide logical NAND, logical OR and logical inverter gates.

8 Claims, 8 Drawing Figures

Figure 1A:
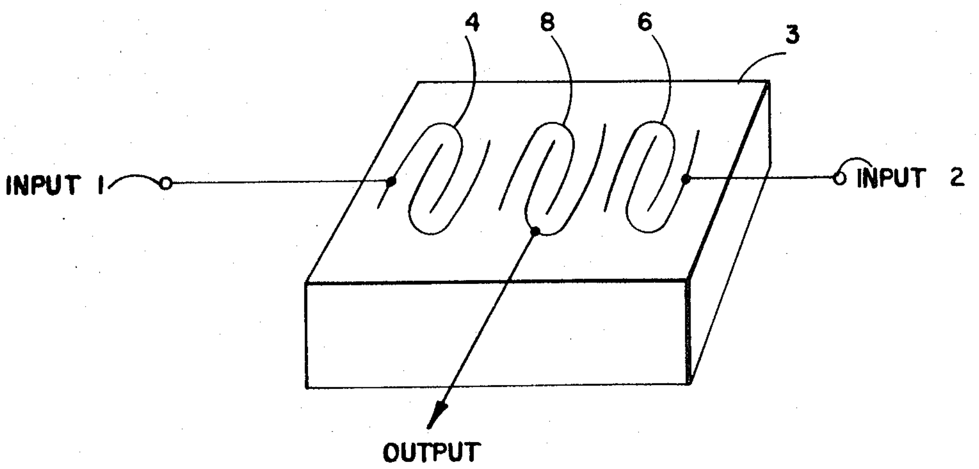

INVENTORS
JOHN M. OWENS
GARY F. SALLEE
BY Joseph E. Kieninger
ATTORNEY

INVENTORS
JOHN M. OWENS
GARY F. SALLEE
BY Joseph E. Kieninger
ATTORNEY

SURFACE ACOUSTIC WAVE COMPUTER LOGIC ELEMENTS

BACKGROUND OF THE INVENTION

1. Field of the Invention

This invention relates to logic gates and more particularly to logic gates using surface acoustical waves.

2. Description of Prior Art

The use of logic gates in computers is well established. Typically, these logic elements for computer use have been built with transistor elements. The speed of these logic elements are determined by the speed of the transistor element used to form the logic element. Typically the speed of semiconductor logic elements is of the order of 10 to 50MH$_z$. Similarly, the energy level required for these logic elements depends upon the energy level required for the transistors employed, for example, 0.5ma per gate in a T$^2$L system.

SUMMARY OF THE INVENTION

It is a primary object of this invention to provide an improved logic element.

It is another object of this invention to provide a faster logic element.

It is yet another object of this invention to provide a logic element which is operative on a low energy level.

It is another object of this invention to provide a means of forming a complex logical function in one gate.

It is yet another object of this invention to provide a simple system for utilizing one general form of gate for performing one of three logical operations depending upon the connection of this gate.

These and other objects of this invention are accomplished by logic gates using surface acoustical waves. Specifically, electrical pulses are converted by means of a plurality of transducers in combination with piezoelectric material to surface acoustical waves. The surface acoustical waves are then received and added by still another transducer and converted to an electrical signal for use in the logic system.

Other objects and advantages of this invention will be apparent from the following detailed description wherein a preferred embodiment of the present invention is clearly shown.

IN THE DRAWINGS

Figure 1:
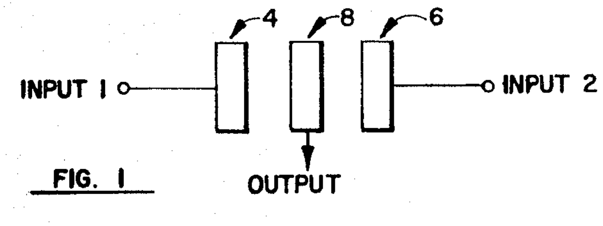

FIG. 1 is the schematic diagram of the general logic gate.

FIG. 1*a* is a three dimensional view of the structure shown in FIG. 1.

Figure 2:
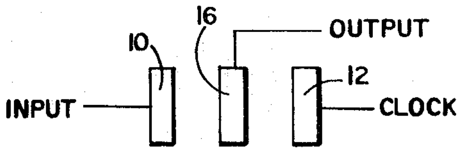

FIG. 2 is a schematic diagram of a logical inverter gate.

Figure 2A:
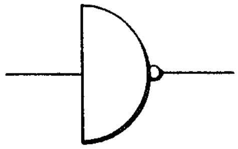

FIG. 2*a* is the logical symbol for the inverter gate shown in FIG. 2.

Figure 3:
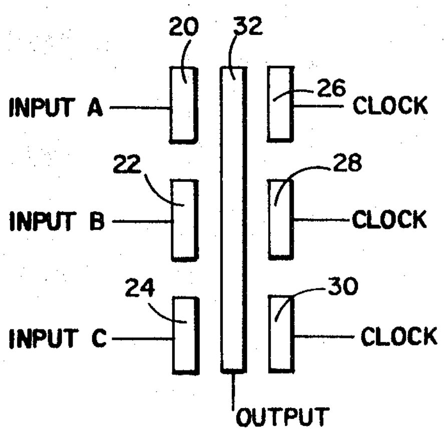

FIG. 3 is a schematic diagram of a three input "NAND" gate.

Figure 3A:
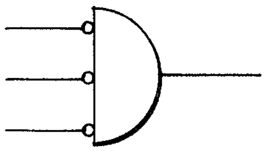

FIG. 3*a* is the logical symbol for the "NAND" gate shown in FIG. 3.

Figure 4:
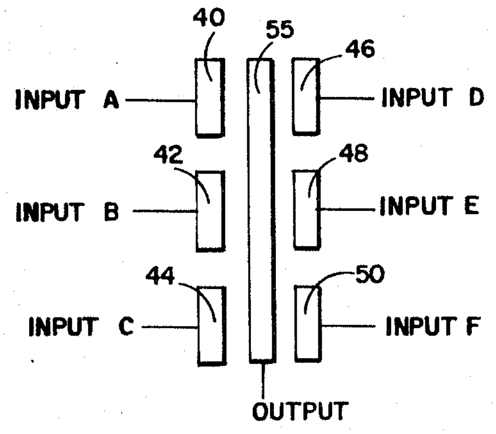

FIG. 4 is a schematic diagram of a six input "OR" gate.

Figure 4A:
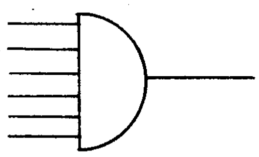

FIG. 4*a* is a logical diagram of the "OR" gate shown in FIG. 4.

DESCRIPTION OF THE ILLUSTRATIVE EMBODIMENT

The basic logic element of this surface wave acoustic logic system is shown in FIGS. 1 and 1*a*. In these figures a surface wave acoustic transducer 4 (such as an interdigital transducer) receives an electrical signal such as an RF signal of a digital signal and produces an electric field in the transducer 4. A piezoelectric medium or material 3 as shown in FIG. 1*a* which serves as a substrate underneath the transducer 4 converts the electrical pulse to a surface acoustic wave. The electric field in the transducer produces a stress in the piezoelectric material which, according to the well known piezoelectric affect, produces a wave which is propagated along the surface. Transducer 6 receives an electrical signal and produces an electric field therein which is converted by the piezoelectric substrate 3 underneath transducer 6 into a surface acoustic wave. The surface acoustic waves from the transducers 4 and 6 are directed across the surface of the substrate 3 toward the output transducer 8. The surface acoustic wave is received by the piezoelectric substrate underneath the output transducer 8 and in cooperation with transducer 8 converts the surface acoustic wave into an electric signal. The output transducer 8 in combination with the piezoelectric substrate 3 in contact therewith converts the algebraic sum of the two surface acoustic waves received from input transducers 4 and 6 into an electrical output signal. If these two are of equal magnitude, then the magnitude of this sum is dependent on their phase relation. If the signals are in phase, the output will be twice that from either signal; and if the signals are 180° out of phase, the output will be zero. Thus the system can be used as an analog algebraic adder. The phase of the signal can be controlled by several techniques. One technique is to generate electrical signals to give the desired phase. A second technique is to space the input transducer to provide an appropriate phase which in turn yields the desired output. A third technique is to shift the phase 180° by the reversing of the polarity of the leads on the inputs.

The basic gate shown in FIG. 1 can be modified to perform NAND, OR and LOGICAL INVERTER functions as indicated in the description which follows. A general gate can be designed whose function can be determined by the interconnection wiring or by the transducer coding.

As shown in FIG. 2, a surface wave acoustic transducer 10 receives an electrical signal such as an RF signal or a digital signal and converts it into a surface acoustic wave. A piezoelectric medium (not shown) is associated with the transducer 10 in converting the electrical pulse to a surface acoustic wave. A transducer 12 receives a clock signal and converts it to a surface acoustic wave. The transducer 12, a piezoelectric medium, is associated with the transducer 12 for the purpose of converting the electrical pulse to a surface acoustic wave. Typically, the clock signal possesses a 180° phase difference from the logic signal received in transducer 10. The surface acoustical waves formed from the logic signal at transducer 10 and the surface acoustical wave pulse from the clock's signal formed in transducer 12 are cultivated toward an output transducer 16. The output transducer 16 in combination with a piezoelectric material converts the surface acoustical waves into an electrical signal such as an RF signal or digital signal. In the logical inverter gate, the clock signal will cancel a logic signal input received from 10. The clock signal will yield an output signal if there is no input signal from the transducer 10.

FIG. 2*a* represents the logical symbol for the schematic diagram of FIG. 2.

As shown in FIG. 3, a three-input NAND gate is formed by the use of multiple inputs through a single output transducer. Transducers 20, 22 and 24 receive separate inputs which are converted in cooperation with piezoelectric mediums (not shown) to surface acoustic waves which are directed towards the output transducer 32. Transducers 26, 28 and 30 receive signals from clocks and possess a 180° phase difference from the logic signals received in transducers 20, 22 and 24, respectively. In this NAND gate an output signal is delivered when less than three of the input transducers 20, 22 and 24 deliver a signal to transducer 32. When all three transducers 20, 22 and 24 deliver a signal to the output transducer 32, there is no output from transducer 32. FIG. 3*a* is logical symbol for the schematic diagram shown in FIG. 3.

As shown in FIG. 4, an OR gate is formed by the use of six input transducers 40, 42, 44 and 46, 48 and 50 which in combination with piezoelectric material convert the individual input signals to surface acoustic waves. The surface acoustical waves that are generated in these transducers are propagated towards the output transducer 52. The output transducer 52 in combination with piezoelectric material (not shown) converts the surface acoustical wave to an electrical output. In this OR gate, any input into any one of the six input transducers 40, 42, 44, 46, 48 and 50 will yield an output signal from the output transducer 52. FIG. 4a is an electrical diagram for the diagram shown in FIG. 4. All of the inputs from transducers 40, 42, 44, 46, 48 and 50 are in phase. The output from transducer 52 will be false only when no input is received from any of the six input transducers. The output 52 will deliver a true signal when a signal from any one of the six transducers delivers a signal.

It is understood that with combinations of the three gates shown in FIGS. 2, 3 and 4 that any logic function can be implemented. The logic gates formed in accordance with this invention utilizing surface acoustical waves are fast and have good data rates of the order of 10–100 MHz. The energy level required for these elements depends on the insertion loss of the transducers, for example, 8 to 10 db loss using quartz piezoelectric and 500 MHz transducers.

EXAMPLE I

Ten 120 MHz transducers were interconnected in two lines of five each in series-parallel combination on Y cut-X propagating quartz. Inputs were connected to a single pulse RF source with phasing accomplished by the interconnection wiring of the transducers. Outputs were series connected together. Using this arrangement, addition and cancellation of logic signals were performed as well as the use of one input and two output transducers for decreased loss.

The output of the gate is an analog signal, that is, it is the algebraic sum of the acoustic signals which arrive at the output transducer. A pair of semiconductor diodes has been used across the output of a gate to provide limiting on the output signals to yield the two level signal necessary for binary logic operation. These diodes limit the output of a gate to a fixed level.

We claim:

1. A logic gate element comprising
a first piezoelectric medium,
a first transducer positioned on said first piezoelectric medium and combining therewith to convert a first electrical input signal to a surface acoustic wave,
a second piezoelectric medium,
a second transducer positioned on said second piezoelectric medium and combining therewith to convert a second electrical input signal to a surface acoustic wave,
a third piezoelectric medium, and
a third transducer positioned on said third piezoelectric medium wherein said third transducer and said third piezoelectric medium combine to convert the surface acoustic waves received from said first transducer and said second transducer to an electrical signal.

2. A logic element as described in claim 1 wherein there are a plurality of said first transducers and a plurality of said second transducers.

3. A logic element as described in claim 1 wherein said second transducer is adapted to provide a clock function.

4. A logic element as described in claim 3 wherein there are a plurality of said first transducers and a plurality of said second transducers.

5. A logic element as described in claim 1 wherein said third transducer adds said first input signal and said second input signal.

6. A logic gate element comprising
a first piezoelectric medium,
a first transducer positioned on said first piezoelectric medium and combining therewith to convert a first electrical input signal to a surface acoustic wave,
a second piezoelectric medium,
a second transducer positioned on said second piezoelectric medium and combining therewith to convert a second electrical input signal to a surface acoustic wave, said second transducer being wired to said first transducer to provide a given function,
a third piezoelectric medium, and
a third transducer positioned on said third piezoelectric medium wherein said third transducer and said third piezoelectric medium combine to convert the surface acoustic waves received from said first transducer and said second transducer to an electrical signal.

7. A logic gate element comprising
a first piezoelectric medium,
a first transducer positioned on said first peizoelectric medium and combining therewith to convert a first electrical input signal to a surface acoustic wave,
a second piezoelectric medium,
a second transducer positioned on said second piezoelectric medium and combining therewith to convert a second electrical input signal to a surface acoustic wave, said second transducer having a phasing relative to said first transducer to provide the desired function of a logic gate element,
a third piezoelectric medium, and
a third transducer positioned on said third piezoelectric medium wherein said third transducer and said third piezoelectric medium combine to convert the surface acoustic waves received from said first transducer and said second transducer to an electrical signal.

8. A logic gate element comprising
a first piezoelectric medium,
a first transducer positioned on said first piezoelectric medium and combining therewith to convert a first electrical input signal to a surface acoustic wave,
a second piezoelectric medium,
a second transducer positioned on said second piezoelectric medium and combining therewith to convert a second electrical input signal to a surface acoustic wave,
a third piezoelectric medium,
a third transducer positioned on said third piezoelectric medium wherein said third transducer and said third piezoelectric medium combine to convert the surface acoustic waves received from said first transducer and said second transducer to an electrical signal, and
at least one semiconductor diode connected to said third transducer and adapted to receive said electrical signal, said diode acting as a limiter for said electrical signal.

* * * * *